(12) United States Patent
Buchheit

(10) Patent No.: US 9,924,602 B1
(45) Date of Patent: Mar. 20, 2018

(54) ENABLING SUBSEQUENT REUSE OF MODULAR DISPLAY/CAMERA COMPONENTS OF A MOBILE COMPUTING DEVICE

(71) Applicant: Brian K. Buchheit, Davie, FL (US)

(72) Inventor: Brian K. Buchheit, Davie, FL (US)

( * ) Notice: Subject to any disclaimer, the term of this patent is extended or adjusted under 35 U.S.C. 154(b) by 219 days.

(21) Appl. No.: 15/012,539

(22) Filed: Feb. 1, 2016

Related U.S. Application Data

(63) Continuation of application No. 13/936,746, filed on Jul. 8, 2013, now Pat. No. 9,253,893.

(51) Int. Cl.
*H05K 3/30* (2006.01)
*H05K 13/04* (2006.01)

(52) U.S. Cl.
CPC ......... *H05K 3/303* (2013.01); *H05K 13/0486* (2013.01); *H05K 2203/176* (2013.01)

(58) Field of Classification Search
CPC ..... H05K 13/0486; H05K 1/189; H05K 3/303
See application file for complete search history.

(56) References Cited

U.S. PATENT DOCUMENTS

| | | | | |
|---|---|---|---|---|
| 6,782,275 B2* | 8/2004 | Mountain | ............ | H04H 40/18 379/433.09 |
| 7,146,191 B2* | 12/2006 | Kerner | ............... | H04L 63/0853 235/487 |
| 7,680,692 B2* | 3/2010 | Meyer | ................... | G06Q 30/02 705/26.1 |
| 8,861,198 B1* | 10/2014 | Asuncion | ............. | G06F 1/1658 361/679.3 |
| 8,922,983 B1* | 12/2014 | Owen | ................... | G06F 1/1656 345/175 |
| 2002/0022000 A1* | 2/2002 | Suetsugu | ........... | B23K 35/0244 423/644 |
| 2003/0037191 A1* | 2/2003 | Baranowski | .......... | G06F 13/387 710/62 |
| 2004/0201968 A1* | 10/2004 | Tafolla | ..................... | G11C 5/02 361/736 |
| 2005/0041459 A1* | 2/2005 | McDonald | ............ | G06F 1/1632 365/154 |
| 2006/0059323 A1* | 3/2006 | Rao | ........................ | G06F 9/5016 711/170 |
| 2008/0002447 A1* | 1/2008 | Gulachenski | ............. | G11C 5/04 365/51 |
| 2014/0132781 A1* | 5/2014 | Adams | ................. | H04N 5/2254 348/207.1 |

\* cited by examiner

*Primary Examiner* — Paul D Kim
(74) *Attorney, Agent, or Firm* — Patents on Demand P.A.; Brian K. Buchheit

(57) ABSTRACT

A modular display or modular camera that is an integrated portion of a mobile phone hardware of a mobile phone can be selected. The modular display/camera component includes a connector having pin-outs that permit data transfer. Traces electronically connect the pin-outs to other electronics of modular display/camera. The modular display/camera when integrated to the logic board is coupled to the logic board by coupling the connector to a matching socket of the logic board. The modular display/camera can be manually removing from the logic board and can be physically mated to a different matching socket within a different device. Thus, the modular display/camera of the mobile phone can be repurposed/reused/recycled for the different device.

20 Claims, 11 Drawing Sheets

US 9,924,602 B1

ENABLING SUBSEQUENT REUSE OF MODULAR DISPLAY/CAMERA COMPONENTS OF A MOBILE COMPUTING DEVICE

CROSS REFERENCE TO RELATED APPLICATION

This application is a continuation of U.S. patent application Ser. No. 13/936,746 (now U.S. Pat. No. 9,253,893) filed on Jul. 8, 2013, which claims priority to Provisional Application No. 61/668,762, filed Jul. 6, 2012. Patent application Ser. No. 13/936,746 and provisional 61/668,762, are hereby incorporated by reference in their entirety.

BACKGROUND

The present invention relates to the field of computing reuse, recycling, green technology and, more particularly, to enabling subsequent reuse of mobile computing device components.

In 2012, on average mobile phones (cell phones) are used for less than eighteen months before being replaced. In America alone in 2012, more than one hundred and forty million mobile phones ended up in a landfill. These phones often contain such toxic materials as lead, cadmium, nickel, and/or lithium. When placed in a landfill, the toxins leech out and can contaminate the soil as well as drinking water.

Current recycling efforts are directed to extracting and reusing precious metals and plastics used in the mobile device creation. These precious metals include silver, gold, copper, and plastic. Reclaiming these substances, however, consumes energy and requires a significant amount of logistic effort, which is costly and time consuming.

DETAILED DESCRIPTION OF THE INVENTION

Figure 1:
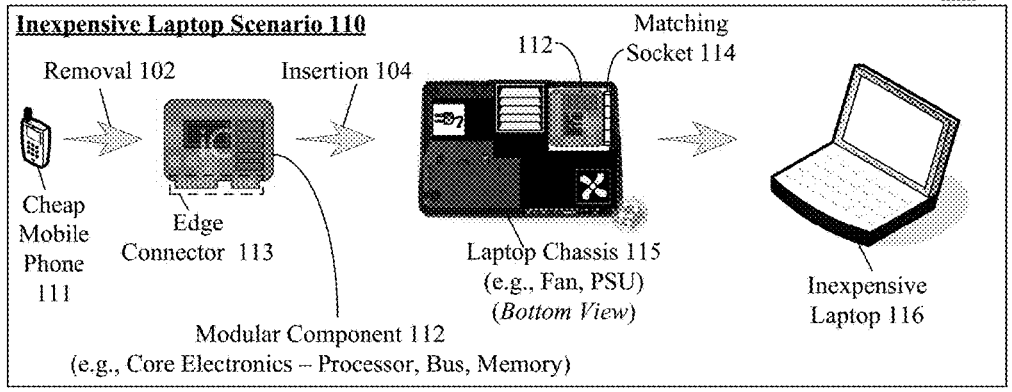
FIG. 1 is a schematic diagram illustrating a set of scenarios for enabling subsequent reuse of mobile computing device components in accordance with an embodiment of the inventive arrangements disclosed herein.
Figure 1:
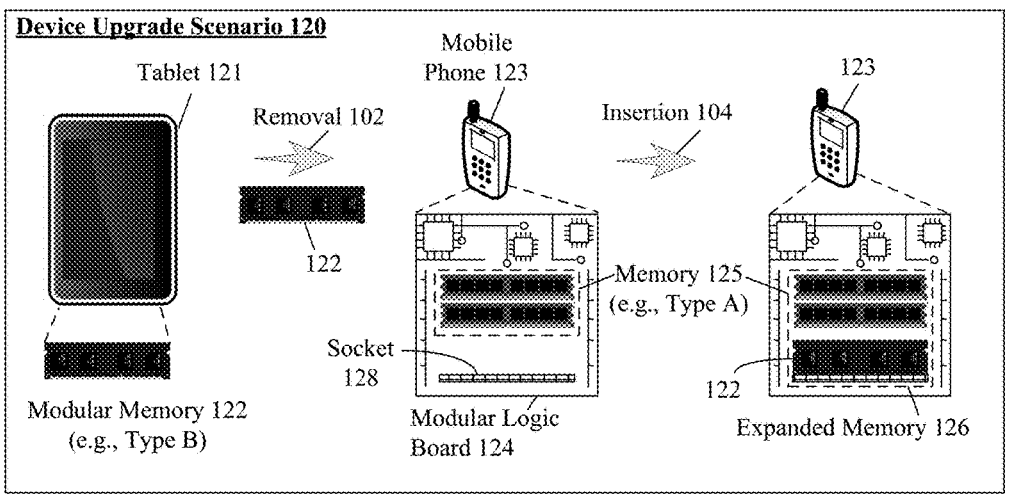
Figure 1:
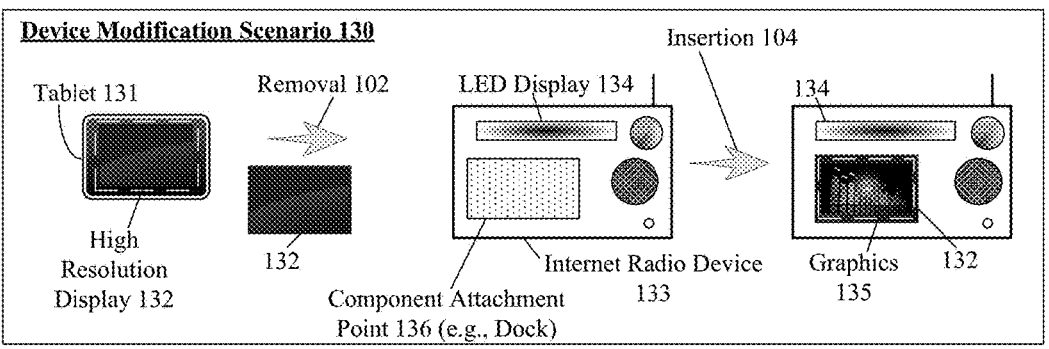

Aspects of the disclosure, take recycling of used mobile devices to a new level, by recognizing that substantial efficient computing capabilities of these devices are able to be repurposed. Instead of "melting down" or otherwise reclaiming components of these devices, the "inherent" processing and computing capabilities are repurposed for a different use. For example, an "old mobile phone" can be componentized and integrated with a refrigerator, to create a "smart refrigerator". Similarly, an "old tablet" may permit its screen to be reclaimed and used as one of many "tiled" components of a "smart wall" for school children to interact with. A camera from a mobile device may be recycled and attached to a socket of a television, to enable video teleconferencing (possibly along with re-using a mobile transceiver for communications). A circuit board from an "outdated" phone can be used to power a BluRay player or home stereo device. In an embodiment of the disclosure, a processor and memory from a phone can be detached and integrated into a thermostat, to create a "smart" thermostat, with energy saving capabilities. In another embodiment, "guts" of a mobile phone can be inserted into a laptop "shell" to reduce the cost of providing a "rudimentary laptop", such as a sub-one hundred dollar laptop to be used as part of a one-laptop-per child initiative. An "old phone" with possible component problems (like a cracked screen) can be repurposed in volume into a new shell for a "cheap" smartphone to be distributed to disadvantaged countries requiring "basic" connectivity.

These advantages and embodiments of the disclosure have largely been ignored in the field. The capability to reuse mobile device components leverages a number of significant operational facts/conditions. First, mobile communication devices (mobile phones, tablets, e-books) are incredibly powerful, relative to other types of consumer electronic devices. Mobile communication devices have a short turnover lifecycle and have been sold in incredible volumes. Most mobile communication devices are manufactured using "cutting edge" plants, which are very power friendly—relative to processes used for other electronic devices. Thus, a DVD player powered in part using "old" recycled mobile device parts is at least as energy efficient as a "standard" manufactured DVD player.

A limited set of compatible chipsets are used to manufacture great volumes of similar mobile devices. This "commonality" permits intelligent reuse and software adaptations, which are based on a specific original chipset/form factor. For example, millions of SAMSUNG® Galaxy S3 phones have been sold, as have millions of IPHONE® 4 devices. A "reuse friendly" manufacture can specifically design a device to leverage the hardware of a specific mobile phone. Many existing mobile devices utilize common ports (like a micro USB2) and common form factors, which help make manufacturing to leverage "excess" computing boards being recycled a relatively easy proposition. Additionally, a number of "general purpose" operating systems (like Android®) have been developed for running on a wide gambit of devices. The necessary device drivers and other components already exist, and the OS is able to be easily repurposed (and often is) for different consumer electronic devices. Advantageously with Android®, legal restrictions—such as licensing restrictions, are relaxed, which facilitate an ability to reuse the underlying hardware of a mobile device. Reusing existing "mobile device" hardware is a win-win-win-win situation for mobile device manufactures (who like making new devices and who are incentivized with planned obsceneness and a short usage life cycle), for down-stream manufactures (who are able to leverage vast computing resources with minimal cost), for end users (who are given the most cutting-edge mobile devices, while being able to put 'old devices' to a good/cost efficient use to the gain of their family or community), and to the environment (as high value recycling minimizes a need to discard valuable components in landfills, and minimizes the need for new "downstream" components, which are replaced with recycled ones).

Stated differently, embodiments of the present disclosure provide a solution for enabling subsequent reuse of mobile computing device components. In the solution, electronic modular components of a source device can be selectively removed and inserted into a target computing device enabling re-use of the components within different devices. In one instance, the disclosure can permit the creation of inexpensive laptops from modular components of a mobile phone. In the instance, a mainboard of a previous generation mobile phone can be removed from the mobile phone case and can be inserted into a laptop chassis. The modular components can include an edge connector, a socket, and the like. In one instance, the components can be mated to a matching socket which can permit the component to be communicatively linked to a device. It should be appreciated that the disclosure is an improvement over existing solutions due to the ability of the disclosure to reuse high value components (e.g., processor, memory) within one or more devices, reducing waste and enhancing consumer options.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is a schematic diagram illustrating a set of scenarios 110, 120, 130 for enabling subsequent reuse of mobile computing device components in accordance with an embodiment of the inventive arrangements disclosed herein. Scenarios 110, 120, 130 can be present in the context of scenarios 210, 220, 230, 310, 320, 330, 410, 430, 440, 450, 460, 510, 520 and an embodiment 530. In scenario 110, 120, 130, modular components from source devices (e.g., phone 111, tablet 121, 131) can be utilized within target devices (e.g., laptop 116, phone 123, radio 133). In scenarios 110, 120, 130, a modular component (e.g., component 112) can be removed from a source device (e.g., phone 111) and placed within a target device (e.g., laptop chassis 115). That is, components from a source device can be integrated within a target device permitting the creation of inexpensive devices, hybrid devices, mesh devices, and the like.

In one embodiment, modular component 112 can include the core electronics (e.g., "guts") of the source device which can be repurposed to perform different functionality. In the embodiment, the core electronics can include components mated to a mainboard (e.g., printed circuit board) of the device. In another instance, the core electronics can be utilized to perform an identical functionality. In yet another embodiment, modular component 112 can be a discrete element. For example, component 112 can be a BLUETOOTH transceiver.

As used herein, source devices can include, but is not limited to, mobile phones, tablet devices, portable music devices, portable electronic devices, and the like. Target devices can include, but is not limited to, mobile phones, tablet devices, portable music devices, portable electronic devices, desktop computers, laptop computers, server computers, home appliances, automotive computers, consumer electronic devices, and the like. It should be appreciated that the source and target devices can conform to different device types, device manufacturers, device functionality, device capabilities, and the like. That is, regardless of the difference between the source device and target device, modular components from the source device can be reused in the target device limiting waste and enhancing consumer options. For example, a consumer of a tablet device can reuse a high resolution display from the tablet to improve the capabilities and/or aesthetics of an internet radio device.

As used herein, edge connector 113 and matching socket 114 can be one embodiment of the disclosure for enabling modular component reuse. Edge connector 113 and/or socket 114 are for exemplary purposes only. Other embodiments are contemplated herein. Edge connector 112 can be a portion of a printed circuit board (PCB) consisting of traces leading to the edge of the board which can be coupled to a matching socket 114. In one instance, edge connector 113 can include one or more pinouts permitting data transfer between a component 112 and other components/devices (e.g., inexpensive laptop 116). Connector 112 can conform to one or more traditional and/or proprietary standards including, but not limited to, a Peripheral Component Interconnect (PCI) standard, PCI Express standard, Advanced Graphics Port (AGP) standard, Universal Serial Bus standard, an Institute of Electrical and Electronics Engineers (IEEE) 1394 interface standard, PC/104 standard, a Portable Digital Media Interface PDMI standard, a ESMexpress standard, a Qseven standard, a Mobile-ITX standard, and a CoreExpress standard. Matching socket 114 can conform to an appropriate standard of the edge connector 113. For example, component 112 can include an edge connector 113 which can conform to a MINI PCI CONNECTOR which can be coupled to a MINI PCI socket 114. In one embodiment, component 112 can include multiple edge connectors 113 which can conform to multiple standards. In the embodiment, component 112 can operate using the appropriate edge connector 113 based on which edge connector 113 is mated to a matching socket. For example, a component including an APPLE DOCK CONNECTOR edge and a MINI PCI edge can communicate with the APPLE DOCK CONNECTOR standard when mated to a APPLE DOCK socket.

Matching socket 114 can be an electro-mechanical device for joining electrical circuits as an interface using a mechanical assembly. The connection can be temporary, as for portable equipment, require a tool for assembly and removal, or serve as a permanent electrical joint between two wires or devices.

In inexpensive laptop scenario 110, a components of a cheap mobile phone 111 can be selected for reuse. Phone 111 can include one or more modular components 112 which can be removed and placed within a laptop chassis 115 to create an inexpensive laptop 116. Modular component 112 can include, but is not limited to, a processor (e.g., CPU/GPU), a non-volatile memory (e.g., FLASH memory), a volatile memory (DRAM), a bus, a cooling component (e.g., intelligent fans), a navigation element (e.g., GPS), a telephony component (e.g., cellular transceiver), a communications component (e.g., WiFi transceiver, BLUETOOTH, a bus), a media component (e.g., camera), a power component, and the like. Modular component 112 form factor can include, but is not limited to, peripheral cards, expansion cards, and the like. In one instance, modular component 112 can include an edge connector 113. Edge connector 113 can permit communication and/or power between component 113 and a device (e.g., device 116). Modular component 112 can be removed from phone 111 via removal action 102. Component 112 can be placed within laptop chassis via insertion 104. Laptop chassis 115 can include one or more components including, but not limited to, a fan, a power supply, and the like. Insertion 104 can include the mating of edge connector 113 with a matching socket 114 which can produce a functioning inexpensive laptop 116. For example, scenario 110 can be a portion of a rugged, low-power, economical computer such as a ONE LAPTOP PER CHILD (OLPC) laptop. That is, chassis 115 can house and power (e.g., integrate) component 112 permitting low cost devices to be created from traditionally unused components within phone 111.

In device upgrade scenario 120, a tablet 121 can include a modular memory 122 which can be reused to upgrade a mobile phone 123. It should be appreciated that memory 122 can be different from memory 125 within phone 123. For example, memory 122 can be a Type B (e.g., DRAM) memory and memory 125 can be a Type A (e.g., SRAM) memory. The modular memory 122 can be removed via removal action 102 and can be inserted into phone 123 via insertion 104. In one instance, the memory 122 can be placed into a modular logic board 124 of phone 123. For example, memory 122 can be placed adjacent to memory 125 utilizing socket 128. Insertion 104 can result in expanded memory 126 which can improve phone 123 performance and/or capabilities. That is, phone 123 memory can be expanded utilizing memory components from a tablet 121.

In device modification scenario 130, a high resolution display 132 can be removed from a tablet 131 and inserted into an internet radio device 133. The display 132 can be removed via removal action 102 and can be inserted into Internet radio device 133. That is, display 132 can be permanently attached to device 133. Device 133 can include, but is not limited to, LED display 134, component attachment point 136, and the like. In one instance, component attachment point 136 can be an APPLE iPOD/iPHONE dock. In one embodiment, display 132 can be utilized by device 133 to present graphics 135 during media playback.

Drawings presented herein are for illustrative purposes only and should not be construed to limit the invention in any regard. In one instance, component 112 can conform to a PCI Industrial Computer Manufacturers Group (PICMG) 1.3 specification. It should be appreciated that modular component removal and insertion can conform to traditional and/or proprietary methods/processes. In one instance, removal and insertion of modular components can be removed without tooling. For example, a component can be removed from a device and integrated into another device by the use of bare hands. In another instance, specific tooling can be utilized to remove and insert components. Tooling can be traditional and/or proprietary tooling. For example, tooling can include a Phillips head screwdriver. It should be appreciated that insertion can include the mating of an edge connector of the component to a matching socket, securing the component to the matching socket, and the like.

Figure 2:
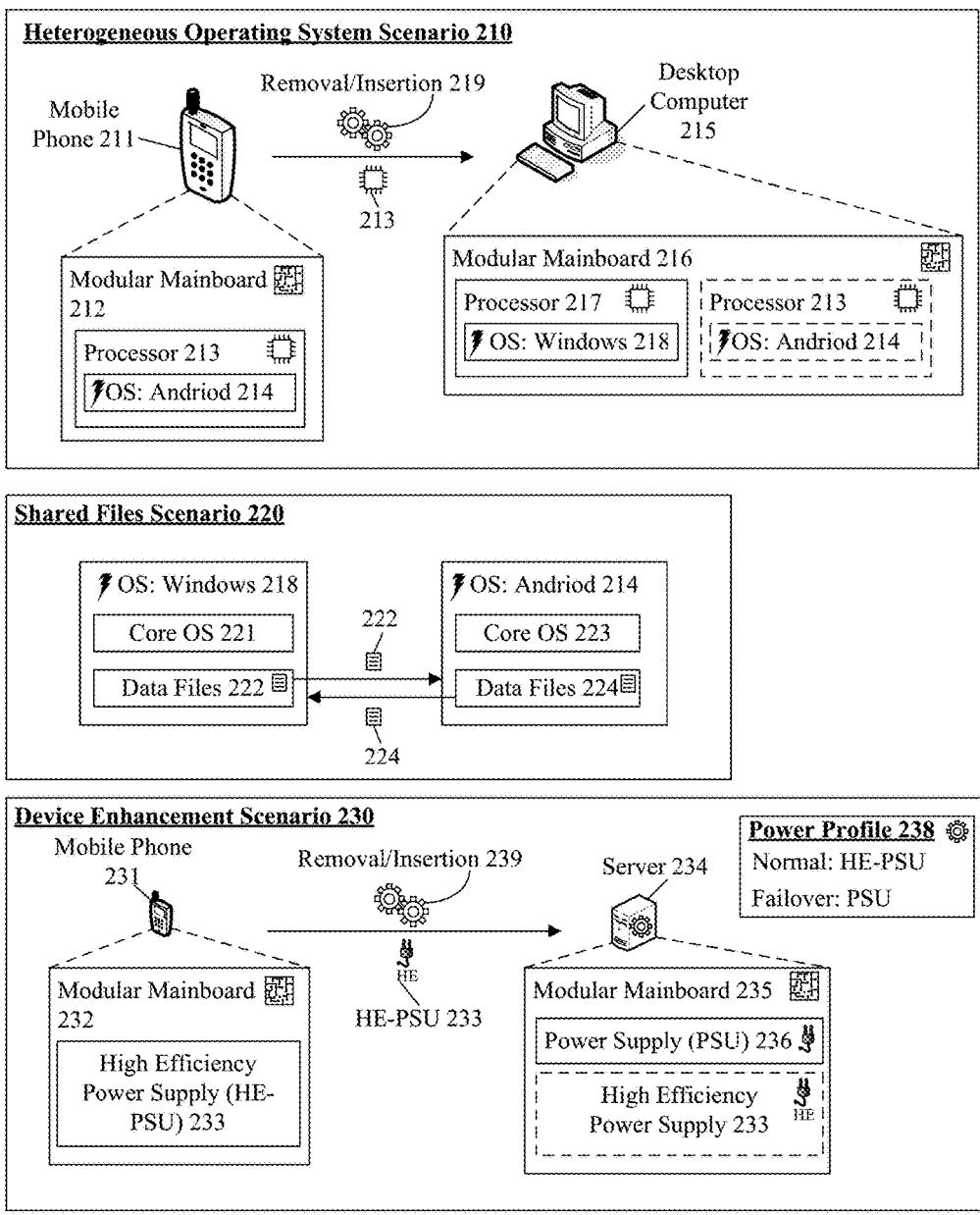
FIG. 2 is a schematic diagram illustrating a set of scenarios for enabling subsequent reuse of mobile computing device components in accordance with an embodiment of the inventive arrangements disclosed herein.

FIG. 2 is a schematic diagram illustrating a set of scenarios 210, 220, 230 for enabling subsequent reuse of mobile computing device components in accordance with an embodiment of the inventive arrangements disclosed herein. Scenarios 210, 220, 230 can be present in the context of scenarios 110, 120, 130, 310, 320, 330, 410, 430, 440, 450, 460, 510, 520 and an embodiment 530. In scenarios 210, 230, a components of a mobile phone can be reused within different devices to create hybrid devices. Hybrid devices can include multiple different operating systems types, multiple different processor types, heterogeneous power supplies, heterogeneous communication stacks, and the like. It should be appreciated that removal and insertion actions are combined within scenarios 210, 230 for simplicity and can be two discrete actions as described within scenario 110, 120, 130.

In heterogeneous operating system scenario 210, a processor 213 of a modular mainboard can be removed from mobile phone 211. In the scenario, processor 213 can execute an operating system such as a GOOGLE ANDROID 214 operating system. The processor 213 can be inserted into a modular mainboard 216 of a desktop computer 215. Computer 215 can include a modular mainboard 216 having a processor 217. Processor 217 can executing an operating system such as a MICROSOFT WINDOWS 218 operating system. The removal/insertion can result in desktop computer 215 having two processors 217, 213. In one embodiment, the computer 215 can be automatically detect processor 213 presence and perform appropriate actions during a boot process. For example, during boot up computer 215 can prompt a user to boot either the GOOGLE ANDROID 214 OS or the MICROSOFT 218 OS. It should be appreciated that MICROSOFT WINDOWS 218 and GOOGLE ANDROID 214 can be referred to as OS 218, OS 214 henceforth for the sake of clarity.

Scenario 220 can illustrate a collaborative heterogeneous environment resulting from scenario 210. In scenario 220, OS 218 and OS 214 can share data files 222, 224. File sharing between OS 214, 218 can be facilitated via an abstraction layer, a file sharing process, and the like. It should be appreciated that Core OS 221, 223 entities can remain independent, permitting each OS 214, 218 to operate traditionally. Files can be shared seamlessly between operating systems. Sharing can be performed via a single OS (e.g., an integration OS), a driver layer of an OS, and the like. It should be appreciated that the scenario is not a "virtualization" solution, since the hardware of the mobile phone executes the OS.

In device enhancement scenario 210, a high efficiency power supply 233 of a mobile phone 231 can be integrated within a server 234. Phone 231 can include a modular mainboard 235 which can be communicatively linked to a high efficiency power supply 233. Supply 233 can be an energy efficient PSU which can waste less energy in heat and can require less airflow to cool. Supply 233 can be removed from modular mainboard 232 and integrated within modular mainboard 235 via removal insertion action 239 action. The result of action 239 can yield server 234 having a power supply 236 and a high efficiency power supply 233. Server 234 can utilize power profile 238 to manage the usage of power supply 236, 233. For example, power profile 238 can permit the usage of the high efficiency power supply 233 during normal operation and the power supply 236 when supply 233 fails. That is, server 234 can be enhanced by reducing power consumption using supply 233 instead of supply 236 for normal operation. In one instance, profile 238 can conform to an advanced power management (APM) profile.

Drawings presented herein are for illustrative purposes only and should not be construed to limit the invention in any regard. It should be appreciated that hybrid devices created from scenario 210, 230 can selectively utilize integrated components to enable high efficiency, optimized performance, and/or high redundancy. It should be appreciated that power supply 233 can include a power supply unit (PSU), a power control logic board, and the like. In one instance, supply 233 can conform to an 80 PLUS certified power supply. In one instance, supply 233 can conform to a traditional and/or proprietary battery.

In one instance, a hybrid device can be created from a core device with basic functionality (e.g., able to run MICROSOFT WINDOWS), which can permit a core electronics to be coupled to the core device.

Figure 3:
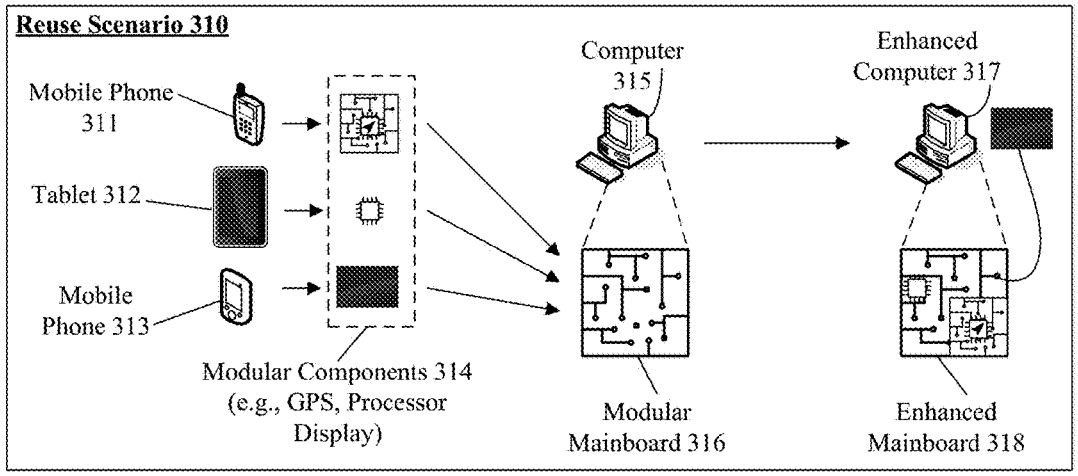
FIG. 3 is a schematic diagram illustrating a set of scenarios for enabling subsequent reuse of mobile computing device components in accordance with an embodiment of the inventive arrangements disclosed herein.
Figure 3:
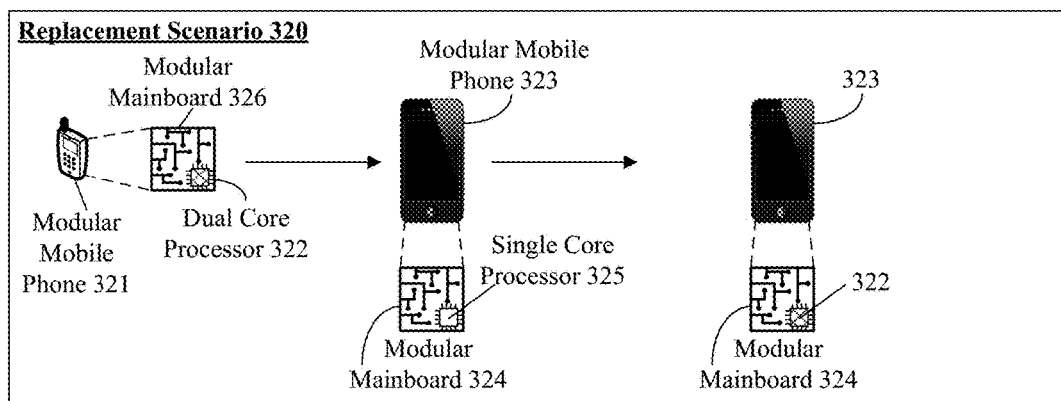
Figure 3:
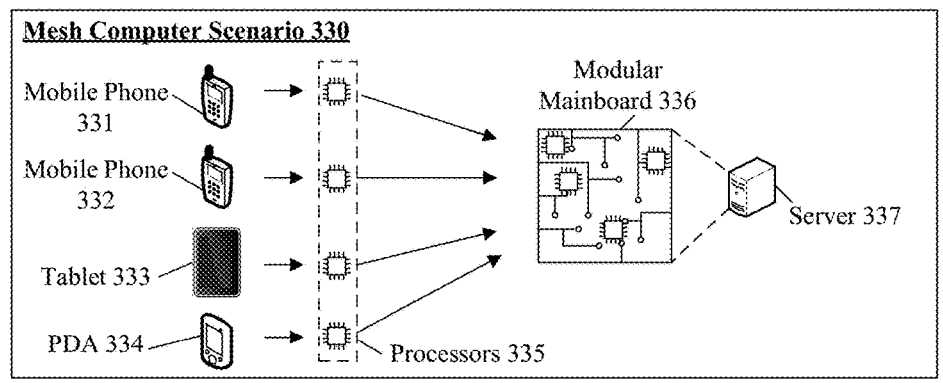

FIG. 3 is a schematic diagram illustrating a set of scenarios 310, 320, 330 for enabling subsequent reuse of mobile computing device components in accordance with an embodiment of the inventive arrangements disclosed herein. Scenarios 310, 320, 330, can be present in the context of scenarios 110, 120, 130, 210, 220, 230, 410, 430, 440, 450, 460, 510, 520 and an embodiment 530. In scenario 310, 320, 330, modular components can be reused within different devices to improve, enhance, and/or extend the different device capabilities.

In reuse scenario 310, components 314 of devices 311-313 can be harvested and utilized to create enhanced computer 317 from computer 315. Modular components 311-313 can include elements such as a Global Positioning System (GPS) chipset, a processor, and a display. Components 311-313 can be easily integrated into an existing modular mainboard 316 of computer 315. For example, a GPS chipset and a processor can be directly mated to mainboard 316 while a display can communicatively linked to the mainboard 318 via a cable (e.g., DVI). In one instance, the scenario can be utilized to leverage an "add-on" system. For example, computer 315 can include a "slot" for a phone which can add touch-screen capabilities (from the phone) to a computer 315 case, which can be integrated with the OS. In one instance, the "guts" of a smart phone can for be used as a cover-facing touch screen within a notebook. For example, the touch screen can be utilized to display email and/or calendar without requiring the notebook screen. That is, the scenario provides a low-no cost expansion option, which can leverage existing equipment.

In replacement scenario 320, a dual core processor 322 from a modular mobile phone 321 can be utilized to upgrade a modular mobile phone 323. In the scenario 320, dual core processor 322 can be decoupled from modular mainboard 326 and coupled to modular mainboard 324 of phone 323 upon the removal of single core processor 325. Scenario 320 can yield a mobile phone 323 with dual core processor capabilities instead of a single core processor 325.

In mesh computer scenario 330, processors 355 from devices 331-334 can be integrated within server 337 to create a mesh computer. Mesh computer can include, but is not limited to, a computer cluster, a distributed computing platform/environment, and the like. Processors 335 can be inserted into modular mainboard 336 of server 337 to create a mesh computer. It should be appreciated that modular mainboard 336 can include existing functioning processors. In one instance, scenario 330 can permit the usage of commodity-grade processors 335 to create a highly integrated, high-performance parallel computing cluster. For example, processors 335 can be utilized to create a BEOWULF cluster. In one instance, many different mobile device "guts" to be added as "cards" to a larger device (e.g., mainboard 336). In the embodiment, the devices "guts" are integrated to form a single functional computing device which can share the total capabilities. For example, adding ten mobile phone "modules" to a server can results in an X core processing device having Y memory, and Z interface ports.

Drawings presented herein are for illustrative purposes only and should not be construed to limit the invention in any regard. In one instance, harvesting of modular components 314 can be performed by a manufacturer, a retail store, and/or a third party entity. For example, a third party entity can employ technicians to remove, test, and validate usable modular components from source devices. It should be appreciated that source devices can include outdated devices (e.g., previous generation devices, discarded devices, partially non-functioning devices, and the like. That is, the disclosure can maximize component reuse from source devices by selectively utilizing functioning components.

In one instance, mainboard 336 can include a backplane (e.g., backplane system) which can be a group of connectors connected in parallel with each other, so that each pin of each connector is linked to the same relative pin of all the other connectors forming a computer bus. In one instance, backplanes can include active or passive backplanes.

Figure 4A:
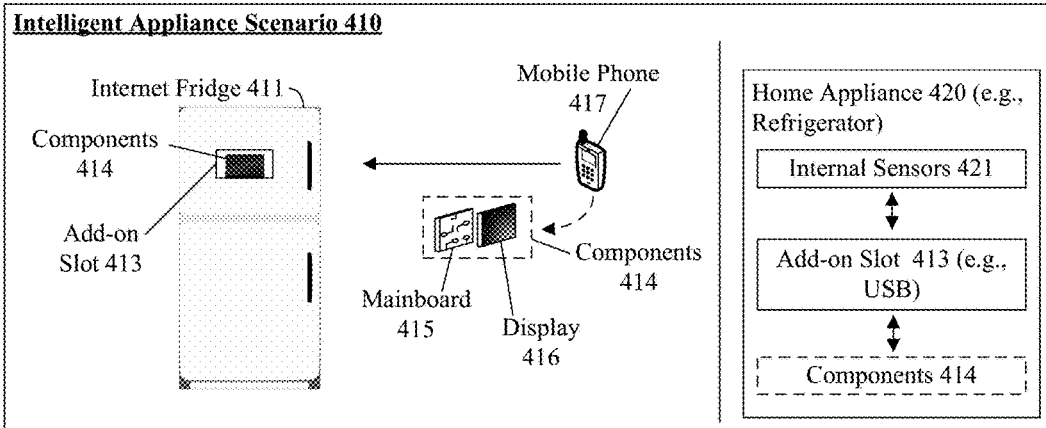
FIG. 4A is a schematic diagram illustrating a set of scenarios for enabling subsequent reuse of mobile computing device components in accordance with an embodiment of the inventive arrangements disclosed herein.
Figure 4A:
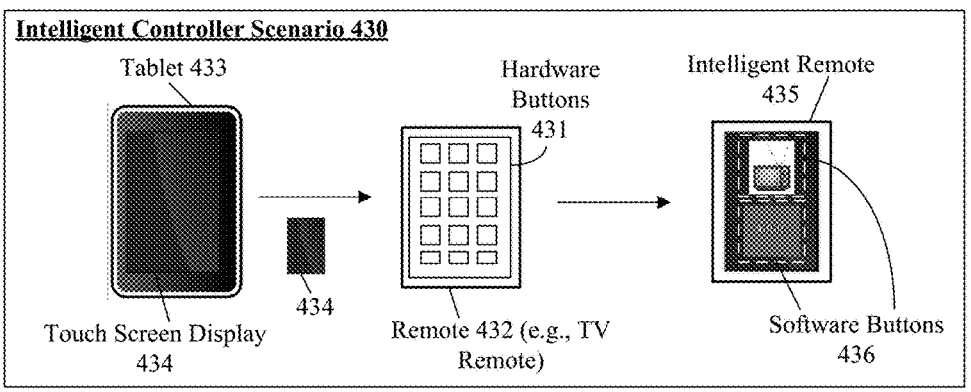
Figure 4A:
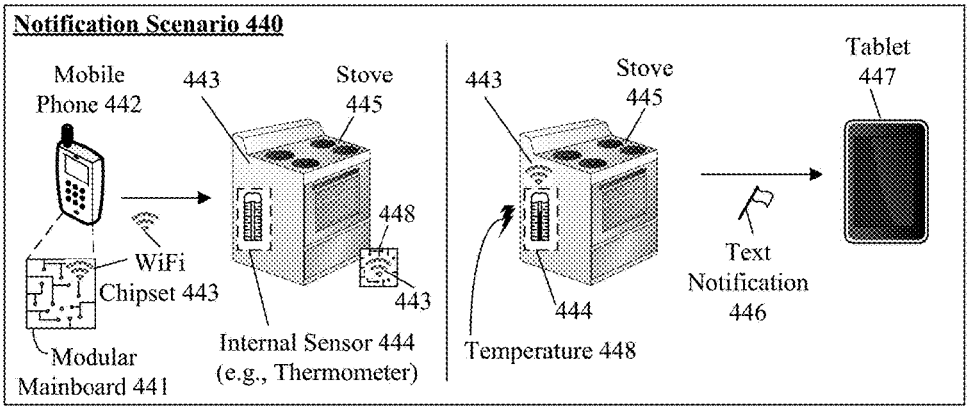

FIG. 4A is a schematic diagram illustrating a set of scenarios 410, 430, 440 for enabling subsequent reuse of mobile computing device components in accordance with an embodiment of the inventive arrangements disclosed herein. Scenarios 410, 430, 440, can be present in the context of scenarios 110, 120, 130, 210, 220, 230, 310, 320, 330, 450, 460, 510, 520 and an embodiment 530. In scenario 410, 430, 440 components from a source device can be utilized to enhance home appliances, consumer electronic devices, and the like.

In scenario 410, components 414 (e.g., core electronics) can be utilized to create an Internet fridge 411 from refrigerator 420. Fridge 420 can lack the capability to perform Web browsing from fridge 420. Components 414 can be can include a mainboard 415 and a display 416. Components 414 can be placed within add-on slot 413. In one embodiment, add-on slot 413 can be a manufacturer provided feature or can be obtained through third-party entities. In one instance, add-on slot can permit communication between fridge 411 and components 414 via a Universal Serial Bus (USB) cable. Fridge 411 functionality can include traditional and/or proprietary functionality. Functionality can include, inventory tracking, Web browsing, scheduling, voice recognition, facial recognition, and the like. In one instance, internal sensor 421 can communicate with components 414 to create Internet fridge 411. Sensor 421 can include, but is not limited to, thermometer, touch sensors, and the like. In one embodiment, display 416 can present the contents of fridge 411. In one embodiment, mainboard 415 can include communications capabilities (e.g., WiFi, BLUETOOTH) which can permit connectivity to the Internet.

In one instance, appliance 420 can include a powered a USB compatible "slot" which can permit communication with internal sensors. For example, plugging in a smartphone "guts" to the USB port can produce an intelligent home appliance for little or no cost. Specific I/O conducted over the USB port can permit data to be passed to and/or from internal sensors of the device to the processing electronic of the smartphone. Customized home appliance applications (OS, platform) can be used to bypass (e.g., "root") the native computing environment of the phone resulting in a completely customized device, which can include Internet capabilities, touch-input, device control, and other functions. The expensive hardware originates from the smartphone core electronics. It can be easily upgradeable and can have low-maintenance cost.

In intelligent controller scenario 430, a touch screen display 434 of a tablet 433 can be utilized to create an intelligent remote 435 from remote 432. Remote 432 can be a remote controller (e.g., television remote) able to control a proximate electronic device (e.g., television). Hardware buttons 431 can be removed and display 434 can be integrated into remote 432. Display 434 can leverage existing remote functionality to present software buttons 436 enabling an intelligent remote 435 to be formed. In one instance, display 434 can be utilized to mimic an identical layout of hardware buttons 431. In another instance, display 434 can include additional electronics (e.g., processor, memory), permitting remote to display complex graphics (e.g., software buttons 436) and accept sophisticated user input (e.g., user programming).

In notification scenario 440, a WiFi chipset 433 from mobile phone 442 can permit stove 445 to communicate with tablet 447. In the scenario 440, WiFi chipset 443 can be removed from modular mainboard 441 and placed within modular mainboard 443 of stove 445. In one instance, chipset 443 can permit text notification 446 to be automatically communicated to tablet 447 via one or more networks. For example, when stove 443 internal sensor 444 reaches temperature 448, a text message can be sent to tablet 447 to notify a user.

Drawings presented herein are for illustrative purposes only and should not be construed to limit the invention in any regard. In one instance, presence of chipset 443 can suppress proximate notifications (e.g., audible alert) and remote notifications (e.g., 446) can be utilized. Home appliance 420 within intelligent appliance scenario 410 can include, but is not limited to, refrigerators, washer/dryers, televisions, DVD/BLURAY players, cable boxes, remote controls, home surveillance systems, and the like.

Figure 4B:
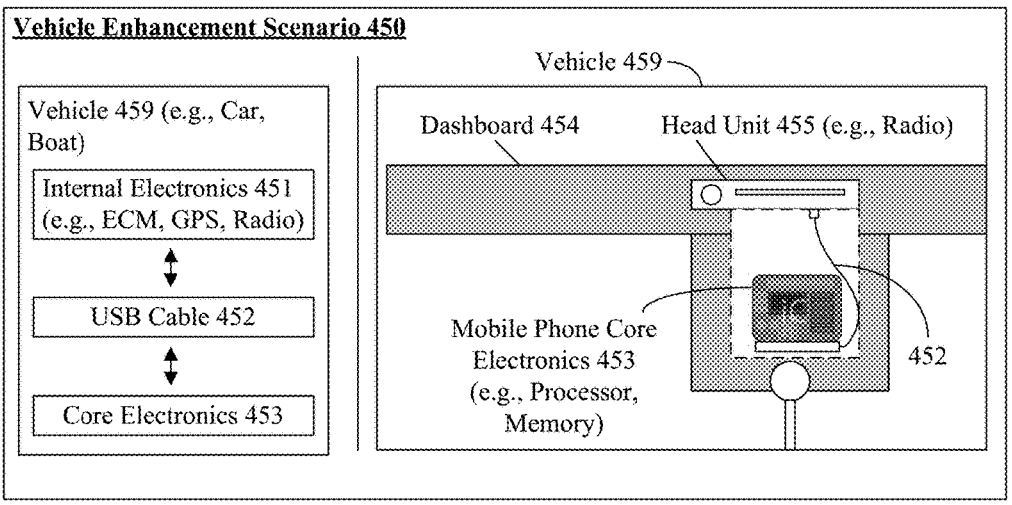
FIG. 4B is a schematic diagram illustrating a set of scenarios for enabling subsequent reuse of mobile computing device components in accordance with an embodiment of the inventive arrangements disclosed herein.
Figure 4B:
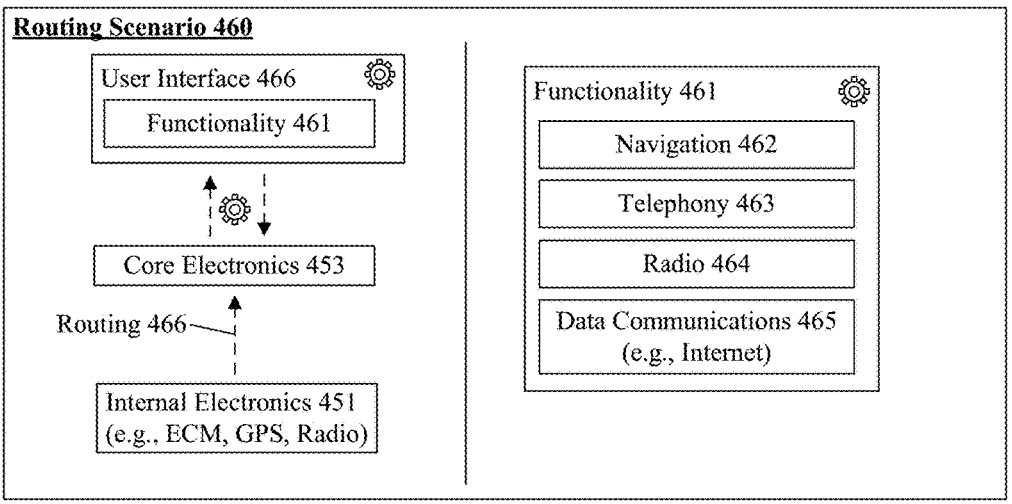

FIG. 4B is a schematic diagram illustrating a set of scenarios 450, 460 for enabling subsequent reuse of mobile computing device components in accordance with an embodiment of the inventive arrangements disclosed herein. Scenarios 450, 460, can be present in the context of scenarios 110, 120, 130, 210, 220, 230, 310, 320, 330, 410, 430, 440, 510, 520 and an embodiment 530.

In vehicle enhancement scenario 450, a mobile phone core electronics 453 can be utilized to supplant a vehicle 459 internal electronics. Electronics 453 can be obtained via methods/processes described within scenarios 110, 120, 130, 210, 220, 230, 310, 320, 330, 410, 430, and/or 440. Electronics 451 can be present within vehicle 459 cabin (e.g., dashboard 454), engine bay, chassis, and the like. Electronics 451 can include, a head unit 455, a engine control management (ECM) computer, a Global Positioning System (GPS), and the like. For example, a head unit 455 can be present within a dashboard 454. Head unit 455 can perform media playback and GPS functionality. In one instance, electronics 453 can be inserted within the dashboard 454 and communicatively linked via a USB cable 452. For example, the dashboard 454 can include a mounting bracket permitting the attachment of electronics 453 proximate to head unit 455. It should be appreciated that electronics 453 can be communicatively linked via a traditional wiring harness of head unit 455.

Scenario 460 can represent a functionality flow resulting from communicatively linking electronics 453 within internal electronics 451. In routing scenario 460, functionality 461 associated with can be dynamically routed 466 to core electronics 453. That is, core electronics 453 can act as an intermediary layer performing operations traditionally executed by internal electronics 451. Functionality 461 can include, but is not limited to navigation 462, telephony 463, radio 464, data communications 465, and the like. It should be appreciated that functionality 461 can be capabilities of a user interface 466. User interface 466 can be a hardware/software interface for interaction with vehicle 459 electronics 461.

Drawings presented herein are for illustrative purposes only and should not be construed to limit the invention in any regard. Vehicle 459 can include, but is not limited to, automobiles, boats, aircrafts, and the like.

Figure 5:
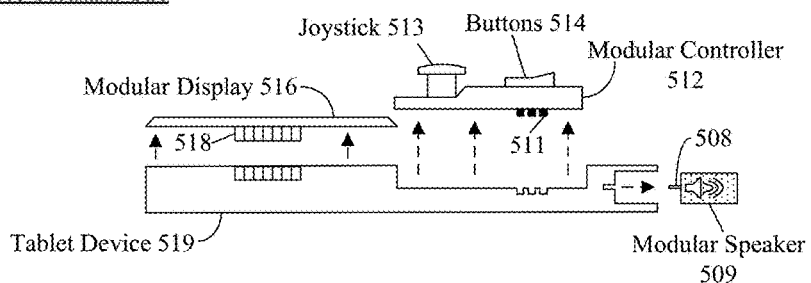
FIG. 5 is a schematic diagram illustrating a set of scenarios and an embodiment for enabling subsequent reuse of mobile computing device components in accordance with an embodiment of the inventive arrangements disclosed herein.
Figure 5:
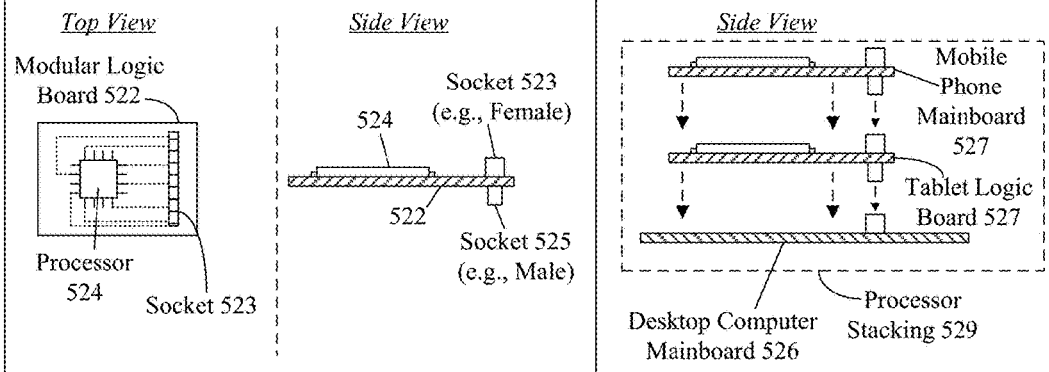
Figure 5:
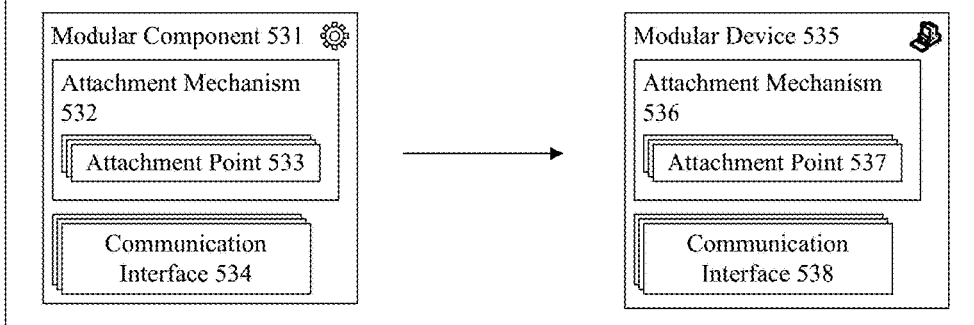

FIG. 5 is a schematic diagram illustrating a set of scenarios 510, 520 and an embodiment 530 for enabling subsequent reuse of mobile computing device components in accordance with an embodiment of the inventive arrangements disclosed herein. Scenarios 510, 520 and an embodiment 530 can be present in the context of scenarios 110, 120, 130, 210, 220, 230, 310, 320, 330, 410, 430, 440, 450, and/or 460. Scenarios 510, 520, and embodiment 530 can represent a modular design architecture for portable electronic devices (e.g., mobile phones, tablets, etc).

In modular device scenario 510, a tablet device 519 can be modularly designed enabling selective coupling/decoupling of components 509, 512, 516. Components 509, 512, 516 can include, but is not limited to, a modular speaker, a modular controller, a modular display, and the like. Components 509, 512, 516 can be coupled to tablet device 519 via connectors 508, 511, 518. Connectors 508 511, 518 can be different or can be identical. That is, device 519 can support multiple standards of connectivity.

In modular processor stacking scenario 520, a modular logic board 522 can include a processor 524 and/or a socket 524. In scenario 520, a side and top view can be presented of board 522. In one instance, board 522 can include butterfly backplanes permitting processor stacking 529. In the instance, butterfly backplanes can include socket 523 and a socket 525. For example, socket 533 can be a female socket and socket 525 can be a male socket. In the scenario, a mobile phone mainboard 527 and a tablet logic board 527 each having a processor 524 can be coupled to a desktop computer mainboard 526. In the scenario, a male socket of a mobile phone mainboard 527 can be coupled to a female socket of a tablet logic board 527. For example, a desktop computer can be enhanced by adding multiple processors to a mainboard 526 by processor stacking 529.

In extensible computing device embodiment 520, a modular component 531 can be coupled to a modular device 535. Modular component 531 can include, but is not limited to, an attachment mechanism 532, a communication interface 534, and the like. Modular device 535 be a portion of a computing device which can permit modular components 531 to be coupled to the device. Device 535 can include, but is not limited to an attachment mechanism 536, a communication interface 534, and the like. Attachment mechanism 532, 536 can include, one or more attachment points 533, 537, fastening mechanisms, alignment mechanisms, and the like. Attachment mechanism 532, 536 can include an attachment point 533, 537. Communication interface 534, 538 can include, but is not limited to, a wired communication channel, a wireless communication channel, and the like.

Drawings presented herein are for illustrative purposes only and should not be construed to limit the invention in any regard. It should be appreciated that the embodiment 530 can permit portable electronic devices to be modularly designed. That is, devices can be designed to facilitate re-use of components. In one instance, removal and/or insertion of components 531 can be performed while the device 535 is powered on. For example, removal and/or insertion can be supported by a "hot swap" capability of the modular design of device 535 and/or component 531. In another instance, removal and/or insertion of the component 531 can be performed while the devices are powered off.

Figure 6:
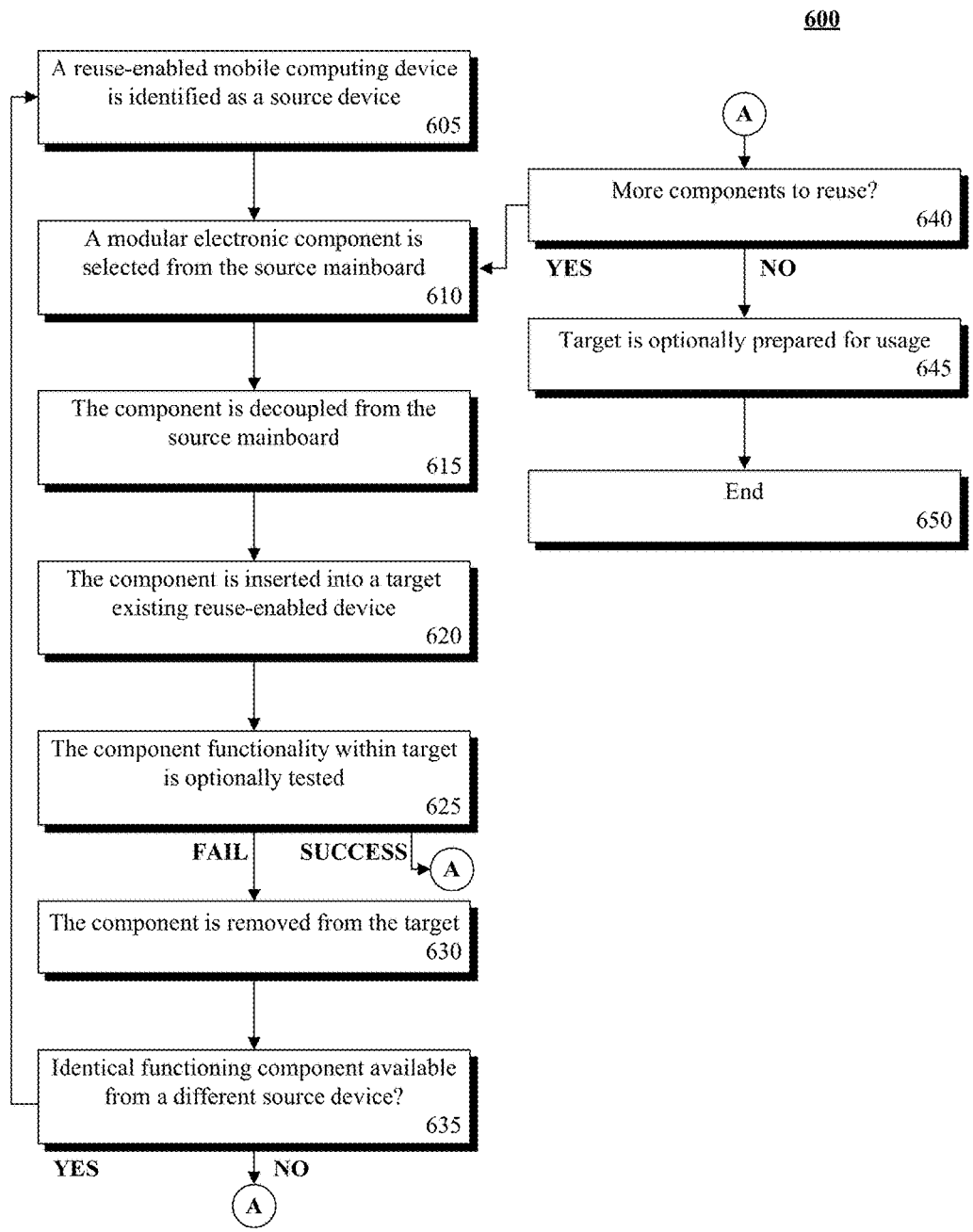
FIG. 6 is a schematic diagram illustrating a method in accordance with an embodiment of the inventive arrangements disclosed herein.

FIG. 6 is a schematic diagram illustrating a method 600 for enabling subsequent reuse of mobile computing device components in accordance with an embodiment of the inventive arrangements disclosed herein. Method 600 can be present in the context of scenarios 110, 120, 130, 210, 220, 230, 310, 320, 330, 410, 430, 440, 450, 460, 510, 520 and an embodiment 530.

In step 605, a reuse-enabled mobile computing device can be identified as a source. In step 610, a modular electronic component can be selected from a mainboard associated with the source. In step 615, the component can be decoupled from the source mainboard. In step 620, the component can be inserted into a target existing reuse-enabled device. In step 625, if the component functionality is tested with in the target device successfully, the method can continue to step 640, else continue to step 630. In step 630, the component can be removed from the target device. In step 635, if an identical functioning component is available from a different source device, the method can return to step 605, else continue to step 640. In step 640, if there are more components to reuse, the method can return to step 610, else continue to step 645. In step 645, the target can be optionally prepared for usage. In step 650, the method can end.

Drawings presented herein are for illustrative purposes only and should not be construed to limit the invention in any regard. The method 600 can be performed by one or more human agents associated with a manufacturer, retailer, and/or third party entity. For example, method 600 can be a portion of a manufacturer reuse program permitting previous low tier generation mobile phone components to be utilized to create middle tier current generation mobile phones.

Figure 7:
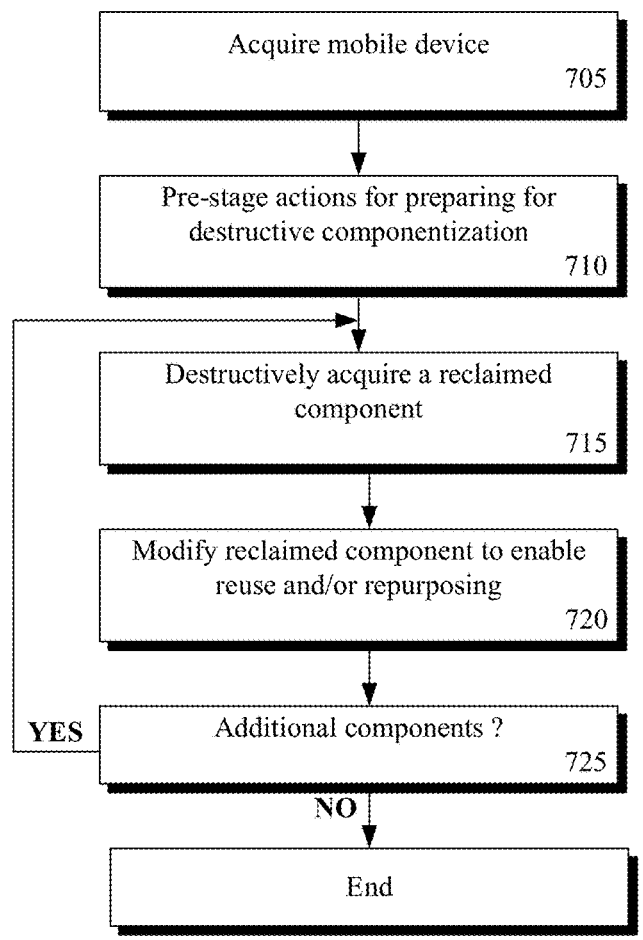
FIG. 7 is a flow chart for a destructive componentization of a mobile device in accordance with embodiments of the disclosure.

FIG. 7 is a flow chart for a destructive componentization of a mobile device in accordance with embodiments of the disclosure. Destructive componentization refers to a one-way decomposition of a mobile device into one or more "reusable" component. To illustrate, most mobile devices utilize a system of a chip (SOC) design in which an integrated circuit (IC) integrates all components of the mobile device into a single chip. The processor, memory, and other components are embedded in a single piece of silicon, which have been fabricated (using a ball grid package) directly into a packaging. Thus, the components are "embedded" into a single board. In one embodiment, this board can be intentionally perforated, so that it can be "snapped" apart, where once snapped apart, the resulting components are able to be repurposed. In one embodiment, disconnected (repurposed) components can include ports/sockets/connectors, which are unused in the integrated board, which are designed exclusively for downstream use. For example, camera components integrated into a board and included board components can be destructively detachable, at which point they are able to be "plugged" into a different system. In another embodiment, memory and CPU can be destructively separated from the device, where they may be repurposed after being disconnected.

The general "package" of a mobile device may be destructively componentized in one embodiment. For example, often glues are utilized to integrate a touch-screen to a device, which makes screen replacement difficult. The screen may be destructively decoupled (which involves breaking a portion of the molding/structure holding the screen in place, which allows the screen to be repurposed in another device (to which the screen is connected after destructive decomposition).

In still another example, a wireless transceiver of a mobile device can be destructively componentized, which permits it to be reused (separate from the rest of a circuit) by a one-way decoupling process.

As used herein, a destructive componentization of the mobile device refers to a physical alteration, which separates components that were integrated before the physical alteration, which after the physical alteration cannot be reformed. Hence, the destructive componentization is a one-way process. Destructive componentization can be designed for one-time end-user actions in one embodiment. In another embodiment, the destructive componentization may be a "factory" or "recycling center" activity, which may require specialized hardware and/or sophisticated knowledge.

The destructive componentization process 700 can begin in step 705, where a mobile device is acquired. In step 710, one or more pre-staging steps may be taken. For example, a specific subset of screws and/or parts (like a battery) can be initially removed to place the mobile device in a destructive componentization state. In this state, a one-way (irreversible) set of actions can be taken. These actions can separate one or more components of the device from other components of the device, which are not able to be reformed. In step 715, at least one resulting component (referred to herein as a reclaimed component) that has been destructively acquired (resulting from the destructive composition) can be reclaimed. In step 720, the reclaimed component can be optionally modified. For example, an external "port" or coupling can be attached for communications in a to-be-inserted device. In one embodiment, a portion of an original board can be "scraped" away to reveal an integration component (a communication slot previously hidden) for integration into a to-be-inserted device. If the reclaimed component includes a storage area that stores data or program instructions, this area can be updated at this stage, so that included program instructions are purposed for the to-be-inserted device/apparatus.

In step 725, if there are additional components to be reclaimed, the process can loop to step 715. Different contemplated "reclaimable" components include, but are not limited to a camera, a speaker, a processor (CPU), a video processing unit (APU), RAM (otherwise integrated into a SOC), a network transceiver (3G, 4G, WIFI, BLUETOOTH, etc.), a touch-screen, a touch pad, and combinations thereof. The destructive componentization can be done to salvage the most valuable components first, and to ensure that communication ports to these components exist. For example, a memory and CPU component can be destructively acquired with a USB port integrated into a circuit, where the USB port provides a data I/O and a power channel for the memory and CPU.

In one embodiment, the destructive componentization can componentize in a manner that includes one or more proprietary components that are to be intentionally disabled, which are off limits for re-use. The disabling can occur through physical modification (detaching an essential physical component for using the disabled component), though a software/firmware means (not providing an ability to utilize the component, such as disabling/deleting necessary drivers for the disabled component), and the like.

Figure 8:
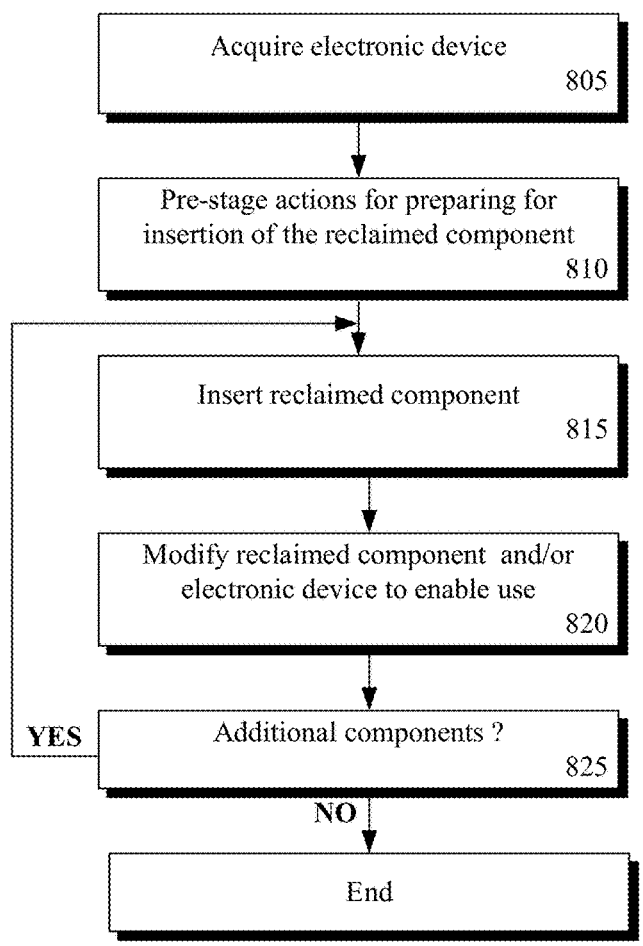
FIG. 8 is a flow chart for reclaimed component integration into an electronic device in accordance with embodiments of the disclosure.

FIG. 8 is a flow chart for reclaimed component integration into an electronic device in accordance with embodiments of the disclosure. The process of FIG. 8 can occur in a device that integrates one or more component from the mobile device after destructive componentization occurs.

In one embodiment, the "baseline" electronic device receiving a component is fully functioning before integration. That is, the integration of the reclaimed component can function to enhance existing capabilities and/or to provide additional or failback capabilities to the acquiring electronic device. For example, if an acquired "component" from a mobile device includes BLUETOOTH transceiving capabilities that the acquiring device lacked before integration, then the integration enhances the existing capabilities to add BLUETOOTH communications. In another embodiment, the receiving device can include a single core ARM processor, and the acquired component can include a quad core ARM processor that is substantially more powerful than an original component. The integration may cause the "new processor" having greater capabilities to be used for at least CPU intensive tasks, when integrated into the enhanced device. The old or original processor may still function, or may have all of its functioning replaced with the added component, depending on implementation specifics of a given integration.

In one embodiment, a "baseline" electronic device receiving a component is not fully functioning before the reclaimed components are added. For example, a laptop "shell" lacking CPU, memory, and the like (but having a user-facing shell of a keyboard, display, etc.) can be created for accepting a processing board of a mobile device. When integrated, the board can be communicatively linked to the display, keyboard, and external ports. Thus, the enhancement provides otherwise lacking "core processing" or "guts" to the baseline electronic device.

In one embodiment, the reclaimed components may have capabilities that are not desired by the baseline electronic device, which are either ignored, or are intentionally disabled. For example, the baseline electronic device may have WIFI transceiving capabilities and the integrated component can have these capabilities (among others) as well, which are disabled during the integration process with the new baseline electronic device. Disabling unnecessary components may reduce confusion, save power otherwise consumed, or have other beneficial effects.

The component integration process 800 can begin in step 805, where a baseline electronic device can be acquired. In step 810, one or more pre-stage actions for preparing for the component integration can occur. For example, a cover may have to be removed from the baseline device to expose an extensible region within which the reclaimed components are able to be inserted. In step 810, firmware/drivers/software of the electronic device may have to be upgraded to permit the integration of the acquired component. In step 815, a reclaimed component can be inserted into a suitable socket/slot of the acquiring device. In step 820, the inserting may modify the reclaimed component and/or may create a "mating" with data communication and/or power lines. Additional sockets may have to be added to the reclaimed component and/or acquiring device slot before the component is able to be properly integrated electronically. In step 825, if additional components are to be added, these can be acquired by looping to step 815. Once all components have been integrated, any exposed regions of the acquiring electronic device can be closed, re-boots can occur, and other such actions (software/firmware updates) can complete.

In one embodiment, an ability to destructively componentize and/or integrate components can have design and manufacturing time consequences. A set of reuse and/or componentization standards can be developed for components, and mobile devices and devices that reutilize their components can be designed to these standards to maximize reusability. It is completed that government incentives related to recycling and energy savings (such as tax breaks, credits, and other incentives) can be granted for compliance with established reuse and reclamation actions. Aggregate gains (similar for those of a naturally monopoly) can emerge, which results in positive performance feedback cycles, which encourages the cycle of reuse. It is completed that one or more nations may regulate to require a certain degree of component reuse (or may assert penalties for negative environmental impacts) if reuse standards are not utilized by device manufactures.

Numerous Web sites and assistance tools are contemplated for facilitating the reclamation of mobile device components. For example, a manufacture may list within a Web site for product support a set of components able to be reclaimed from a given mobile device as well as any standards for reuse that a given mobile device is compliant with. Web sites for electronic devices able to integrate reclaimed components may also provide listing of compatible standards, mobile devices, components, and the like. It is contemplated that carriers and carrier stores may establish programs to reclaim components, where end-users donating mobile device receive financial benefits that are based on a value of reclaimed components. It is contemplated that secondary marketplaces can develop for auctioning (or otherwise facilitating resale of) reclaimed components. For example, a carrier receiving recycled mobile devices may utilize a secondary marketplace to extract a maximum amount of value from these assets, while a device maker may utilize the secondary reclamation market to secure a set of necessary reclaimed components (at a favorable price) to match commitments. Additionally, end-users may purchase reclaimed components from a resale market (secondary marketplace) to enhance purchased (or to be purchased) electronic devices designed for these reclaimed components. Web sites can be established to update firmware/software to enable features of electronic devices, which are provided by reclaimed components. Operating systems (like Android®) can be purposefully extended to enable reclaimed component reuse among devices running on the platform.

Although examples for user interface are expressed as having been provided by Web sites, other interfaces are contemplated. For example, any of the interfaces referred to as Web sites (see FIG. 9 and FIG. 10, for example) can also be provided within an application running on a mobile device, within a front end interface of a stand-along computing program, within a voice user interface, and the like.

Figure 9:
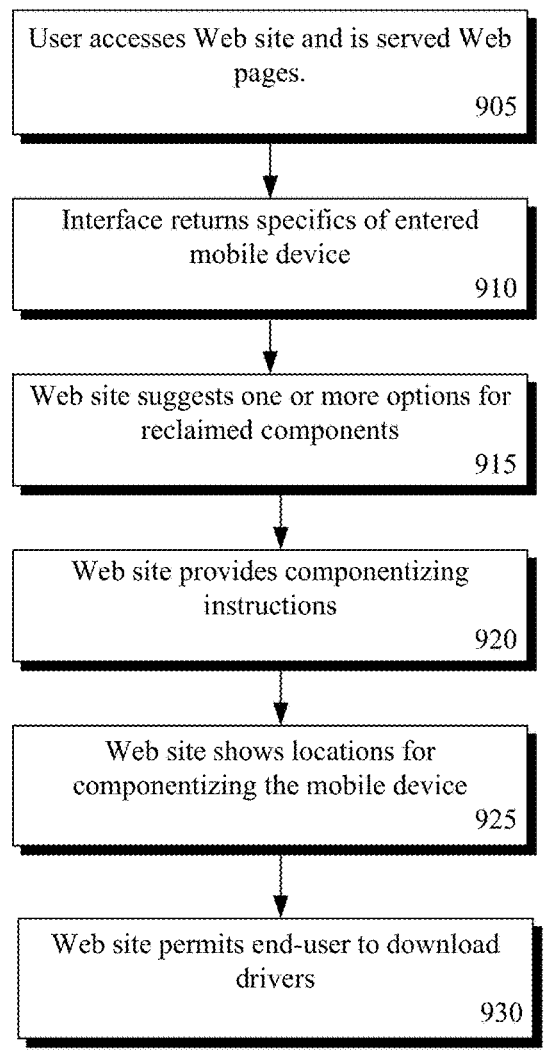
FIG. 9 is a flow chart for valuating and reclaiming components from a mobile device in accordance with embodiments of the disclosure.

FIG. 9 is a flow chart for valuating and reclaiming components from a mobile device in accordance with embodiments of the disclosure.

The flowchart process 900 can begin when a user accesses a Web site and is served Web pages. The Web pages can include user interface input elements for a user to specify a mobile device, which is able to be componentized, as shown by step 905. In step 910, the interface can return specifics for the entered device. The specifics can show a list of components included in the input mobile device, which are able to be reclaimed. Reclamation may be through destructive componentization or through a non-destructive process. In one embodiment, each reclaimable component may indicate a corresponding value (in dollars or reclamation credit) for the component. This value may be paid by an entity providing the Web site. The Web site can also indicate technological versions and/or capabilities provided by each component shown.

In one embodiment, shown by step 915, the Web site can suggest one or more use-options for the reclaimed components. For example, links (or options) to purchase electronic devices that are compatible with a reclaimable component may be shown for user purchase.

In step 920, instructions for componentizing the mobile device may be provided. In step 925, locations able to componentize the mobile device for the user (and associated costs for componentization if any) can be shown.

In step 930, the Web site can permit an end-user to download drivers for each reclaimable component for one or more target platforms.

In one embodiment, the Web site discussed may be utilized by a reclamation center. For example, the reclamation center can utilize a screen showing a set of components and their value, which is used to aid the reclamation center in determining a value to pay a customer for the mobile device (for reclamation purposes). In one embodiment, the value can be applied to a purchase of a new mobile device.

Figure 10:
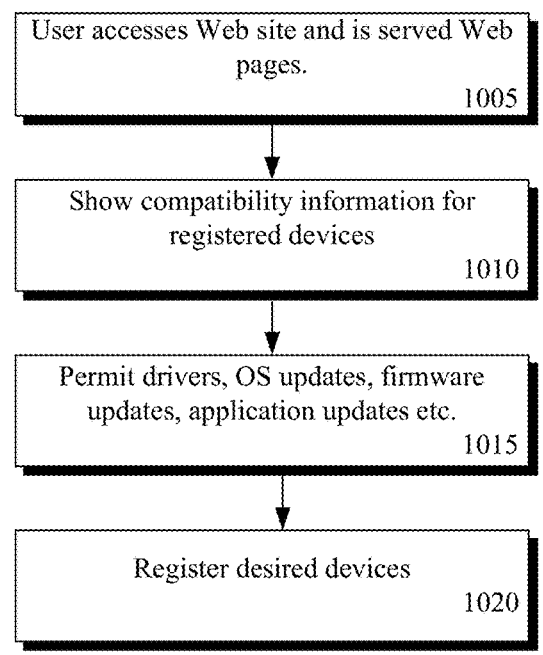
FIG. 10 is a flow chart for registering mobile devices and/or user consumer devices in accordance with embodiments of the disclosure.

FIG. 10 is a flow chart for registering mobile devices and/or user consumer devices in accordance with embodiments of the disclosure.

The flowchart process 1000 can begin when a user accesses a Web site and is served Web pages. The Web pages can include user interface input elements permitting an end-user to register a set of owned electronic devices and/or mobile devices, as shown by step 1005. Once each device is registered, compatibility information can be presented, as shown by step 1010. That is, an end-user can be shown which electronic devices he/she owns can be upgraded by adding one or more reclaimable components from an owned mobile device. In step 1015, drivers, firmware, and other program instructions can be downloaded, for any suggested upgrades. The registered mobile devices can include devices currently deemed "old", which are not connected to a carrier service, as well as devices that are currently in-use. In one embodiment, in-use devices subject to an upgrade discount may be highlighted via the Web site.

In one embodiment, a set of desired, but not presently owned electronic devices can be registered, as shown by step 1020. The Web site can suggest purchases and/or integration options for maximizing functionality of a to-be-purchased device, while minimizing costs by leveraging reclaimed components. Other optimizations are contemplated and cost optimization is one possibility. For example, the Web site can be optimized to show greatest environmental impact/savings able to be achieved by reclaiming components and purposing them into other electronic devices.

In one embodiment, the Web site can be established for an organization, such as a company. Thus, the Web site can help the company leverage reusable and reclaimable components within other electronic devices. In another embodiment, the Web site can be tailored for a specific purpose. For example, the Web site can be designed to assist a technologically struggling school or country, by encouraging denotations of reusable components and/or electronic devices based in part on reclaimable components from mobile devices.

The flowchart and block diagrams in the FIGS. 1-10 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for reusable electronic components comprising:
    selecting a modular display that is an integrated portion of a mobile phone hardware of a mobile phone, wherein the modular display performs a display function for the mobile phone when integrated with a logic board of the mobile phone, wherein the modular display component includes a connector having pin-outs that permit data transfer, wherein traces electronically connect the pin-outs to other electronics of modular display, wherein the modular display when integrated to the logic board is coupled to the logic board by coupling the connector to a matching socket of the logic board;
    manually removing the modular display from the logic board, wherein the removing decouples the connector from the matching socket, wherein the decoupling is tool less; and
    physically mating the modular display to a different matching socket within a different device, wherein the different device and the mobile phone are different device types such that the different device is not a mobile phone, wherein the modular display when physically mated to the different device performs a display function for the different device.

2. The method of claim 1, wherein the different device includes an add-on slot specifically designed for the attachment and use of the modular display.

3. The method of claim 1, wherein the modular display is integrated into a housing of the mobile phone when integrated with the logic board of the mobile phone and is integrated into a housing of the different device when mated to the different matching socket.

4. The method of claim 1, wherein the modular display is a touch screen display providing touch screen functionality to a device to which it is connected, which includes the mobile phone when the modular display is integrated with the logical board and includes the different device when the modular display is mated to the different matching socket.

5. The method of claim 1, wherein the modular display is destructively detachable from the mobile phone, wherein the destructive detachability involves a physical alteration to a structure of the mobile phone to separate the modular display such that destructively detaching the modular display from the mobile phone is a one-way process due to the alteration of the structure.

6. The method of claim 1, wherein the different device is a home appliance, wherein the home appliance is one of a refrigerator, a washer, a dryer, a cable box, a DVD player, a BLURAY player, and a television.

7. A method for reusing modular electronic components of a mobile electronic device comprising:
    selecting a modular display that is an integrated portion of hardware of a mobile electronic device and that is physically integrated with a housing of the mobile electronic device, wherein the modular display performs a display function for the mobile electronic device when integrated with the mobile electronic device, wherein the modular display includes a connector having pin-outs that permit data transfer, wherein traces electronically connect the pin-outs to other electronics of modular electronic component, wherein the modular electronic component when integrated to the logic board is coupled to the logic board by coupling the connector to a matching socket of the logic board;
    manually removing the modular display from the mobile electronic device, wherein the removing decouples the connector from the matching socket; and
    physically mating the modular display to a different matching socket within a different electronic device, wherein the physical mating integrates the modular display to a housing of the different electronic device as well as to integrating the modular display to electronics of the different electronic device, wherein after the physical mating, the modular display performs a presentation function for the different electronic device.

8. The method of claim 7, wherein the different electronic device includes an add-on slot specifically designed for the attachment and use of the modular display.

9. The method of claim 7, wherein the mobile electronic device is a mobile phone.

10. The method of claim 7, wherein the mobile electronic device is an electronic tablet.

11. The method of claim 7, wherein the modular display is a touch screen display providing touch screen functionality to a device to which it is connected, which includes the mobile electronic device when the modular display is integrated with the logical board and includes the different electronic device when the modular display is mated to the different matching socket.

12. The method of claim 7, wherein the modular display is destructively detachable from the mobile electronic device, wherein the destructive detachability involves a physical alteration to a structure of the mobile electronic device to separate the modular display such that destructively detaching the modular display from the mobile electronic device is a one-way process due to the alteration of the structure.

13. The method of claim 7, wherein the different electronic device is a home appliance, wherein the home appliance is one of a refrigerator, a washer, a dryer, a cable box, a DVD player, a BLURAY player, and a television.

14. A method for reusable electronic components comprising:
selecting a modular camera component that is an integrated portion of a mobile phone hardware of a mobile phone, wherein the modular camera component performs an imaging function for the mobile phone when integrated with a logic board of the mobile phone, wherein the modular camera component includes a connector having pin-outs that permit data transfer, wherein traces electronically connect the pin-outs to other electronics of modular camera component, wherein the modular camera component when integrated to the logic board is coupled to the logic board by coupling the connector to a matching socket of the logic board;
manually removing the modular camera component from the logic board, wherein the removing decouples the connector from the matching socket, wherein the decoupling is tool less; and
physically mating the modular camera component to a different matching socket within a different device, wherein the different device and the mobile phone are different device types such that the different device is not a mobile phone, wherein the modular camera component when physically mated to the different device performs an imaging function for the different device.

15. The method of claim 14, wherein the different device includes an add-on slot specifically designed for the attachment and use of the modular camera component.

16. The method of claim 14, wherein the modular camera component is integrated into a housing of the mobile phone when integrated with the logic board of the mobile phone and is integrated into a housing of the different device when mated to the different matching socket.

17. The method of claim 14, wherein the modular camera component is destructively detachable from the mobile phone, wherein the destructive detachability involves a physical alteration to a structure of the mobile phone to separate the modular display such that destructively detaching the modular camera component from the mobile phone is a one-way process due to the alteration of the structure.

18. The method of claim 14, wherein the different device is a home appliance.

19. The method of claim 14, wherein the different device is a refrigerator.

20. The method of claim 14, wherein the different device is a television.

* * * * *